(12) United States Patent
Naum

(10) Patent No.: US 6,457,150 B1
(45) Date of Patent: Sep. 24, 2002

(54) METHOD AND APPARATUS FOR ON-CHIP MONITORING OF INTEGRATED CIRCUITS WITH A DISTRIBUTED SYSTEM

(75) Inventor: Michael C. Naum, Tyngsboro, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/433,233

(22) Filed: Nov. 4, 1999

(51) Int. Cl.$^7$ .......................... G01R 31/28; G06F 11/00
(52) U.S. Cl. .......................... 714/724; 710/120; 714/25
(58) Field of Search .......................... 714/724, 734, 714/714, 726, 733, 47, 42, 43, 44, 39, 25, 30; 703/14; 710/120, 240, 243, 244

(56) References Cited

U.S. PATENT DOCUMENTS 5,793,941 A * 8/1998 Pencis et al. .................. 714/5
6,324,496 B1 * 11/2001 Alur et al. ..................... 703/2

FOREIGN PATENT DOCUMENTS

JP          10106262         4/1998

OTHER PUBLICATIONS

Whetsel, Lee; "Hierarchically 1149.1 Applications in a System Environment"; Proceedings of the International Test Conference, US, New York, IEEE; 1993; Paper 23.1, pp. 517–526.

* cited by examiner

Primary Examiner—Christine T. Tu
(74) Attorney, Agent, or Firm—Kudirka & Jobse, LLP

(57) ABSTRACT

An on-chip monitoring circuit is composed of a plurality of individually addressable nodes that are connected together in a circuit which extends from an external data port to each of the monitored circuit points. Address and enable information is passed from node to node. Each node contains address decoding circuitry and enable generation circuitry. As a node receives address information, it decodes part of the address information and enables some of the nodes connected to it, passing the remainder of the address information to the enabled nodes. This process continues until an end node is reached which is connected to the circuit point which is to be monitored. Data generated at the monitored point is passed back though the enabled nodes to the external data port.

9 Claims, 4 Drawing Sheets

METHOD AND APPARATUS FOR ON-CHIP MONITORING OF INTEGRATED CIRCUITS WITH A DISTRIBUTED SYSTEM

FIELD OF THE INVENTION

This invention relates to testing and debugging of integrated circuits and, in particular, to on-chip systems for monitoring circuit nodes within the circuits.

BACKGROUND OF THE INVENTION

Application-Specific Integrated Circuits or ASICs are chips that contain an array of hardware logic devices that are programmed by a system designer to produce a specific behavior. ASICs have been used for years as a way of providing connection or "glue" logic in a single device on a board, but more recently they have been used to provide the logic for an entire board design on a single chip. This type of circuit design is commonly called a "system on a chip." Even more recently, processors have been included in these designs. Many popular standard CPU architectures such as "ARM" and "MIPS" are available in hardware description language libraries which allows these architectures to be integrated with memory and I/O devices on a single chip to create a custom implementation for a particular application.

The advantage of this approach is a lower overall cost for systems that are produced in relatively high volumes. In addition, system quality is better because there are fewer interconnections between chips on a board, which interconnections are prone to failure. System speed is also much higher because the signal paths within a chip are much shorter than those between chips.

The problem with such complex ASICs is that they are difficult to test and debug because many address and data signals, which are required by many conventional debugging tools and logic analyzers, are not available outside of the chip. One prior art solution is to include software in the chip that allows debug operations to be performed in conjunction with an external debugging system. The problem with this approach is that additional memory is required on the chip to store the debugging software, which memory is only used during a debugging process and, thus drives up the overall cost of the system. Another alternative is to build the debugging software into the design of the CPU itself in the form of a set of microcoded instructions. This alternative has the advantage of always being available to the system, so that problems encountered after the system has been deployed in the field can be debugged in the field. The problem with this approach is that it precludes use of ASIC designs that use CPUs created with popular ARM or MIPS architectures that do not incorporate the debugging instructions. Another option is JTAG technology which uses a 4-pin interface that implements control signals and a bidirectional serial data path. JTAG allows access to registers defined within a chip, and with the proper support built into a chip, the interface can be used to download and execute code, and to examine register and memory values. The problem with such a system is that it lacks real-time trace access to internal system nodes and therefore, some problems, such as timing problems are difficult to detect and correct.

Consequently, another prior art approach has been to equip the ASIC chip with internal hardware which collects internal circuit node data and conveys the debug data externally through a debugging port. However, I/O devices on the ASIC chip often require dedicated pins on the ASIC chip and quickly exhaust the available pins, leaving no room for a parallel debug data path. One method for dealing with this problem is to use a serial interface which requires only a few dedicated pins. With such an interface, a burst of data that exceeds the data transfer rate of the port must either be buffered or lost.

Another prior art solution is to place a data selector onto the ASIC chip which can selectively connect internal integrated circuit nodes to the debugging port allowing a direct trace to be performed on a selected node. An example of such a device is a DW_debugger circuit whose design is generated and licensed by Snopsys, Inc. located at Mountainview, Calif. This circuit includes an internal UART and ASCII engine which will accept a serial stream of bits on a two wire RS232 port, interpret the bits stream as a command plus an address. The command controls a multiplexer which connects a selected multiplexer input to a two wire data port. Each of the multiplexer inputs is connected to an internal circuit node that the ASIC designer wants to monitor.

Although such a device provides a trace path to selected internal circuit points, it requires that each of the selected internal circuit points be connected to the multiplexer by a dedicated wire run. In a complicated ASIC, it may be necessary to monitor hundreds or thousands of discrete points, resulting in hundreds or thousands of wire runs to the location of the multiplexer. These wire runs can greatly impact the physical design of the ASIC chip by limiting the placement of the ASIC functional elements and the routing of the connections, often increasing wire delays. In addition, the large number of wire runs causes severe wire congestion, which, in turn, can seriously hamper timing closure and ultimately increase the time needed to design the circuit.

Therefore, there is a need for a monitoring circuit which can provide direct access to selected nodes in the ASIC and which does not greatly affect ASIC element design and placement and which reduces wire congestion.

SUMMARY OF THE INVENTION

In accordance with one illustrative embodiment of the invention, an on-chip monitoring circuit is composed of a plurality of addressable nodes that are connected together in a circuit which extends from an external data port to each of the monitored circuit points. Address and enable information is passed from node to node. Each node contains address decoding circuitry and enable generation circuitry. As a node receives address information, it decodes part of the address information and enables some of the nodes connected to it, passing the remainder of the address information to the enabled nodes. This process continues until an end node is reached which is connected to the circuit point which is to be monitored. Data generated at the monitored point is passed back though the enabled nodes to the external data port.

In accordance with one embodiment, the nodes are connected in a tree configuration, with each node belonging to one level of the tree.

In accordance with another embodiment, the end nodes are isolated from the circuit points to be monitored until the end nodes are enabled. In this manner an end node does not load the monitored circuit point when monitoring of that point is not taking place.

BRIEF DESCRIPTION OF THE DRAWINGS

The above and further advantages of the invention may be better understood by referring to the following description in conjunction with the accompanying drawings in which.

DETAILED DESCRIPTION

Figure 1:
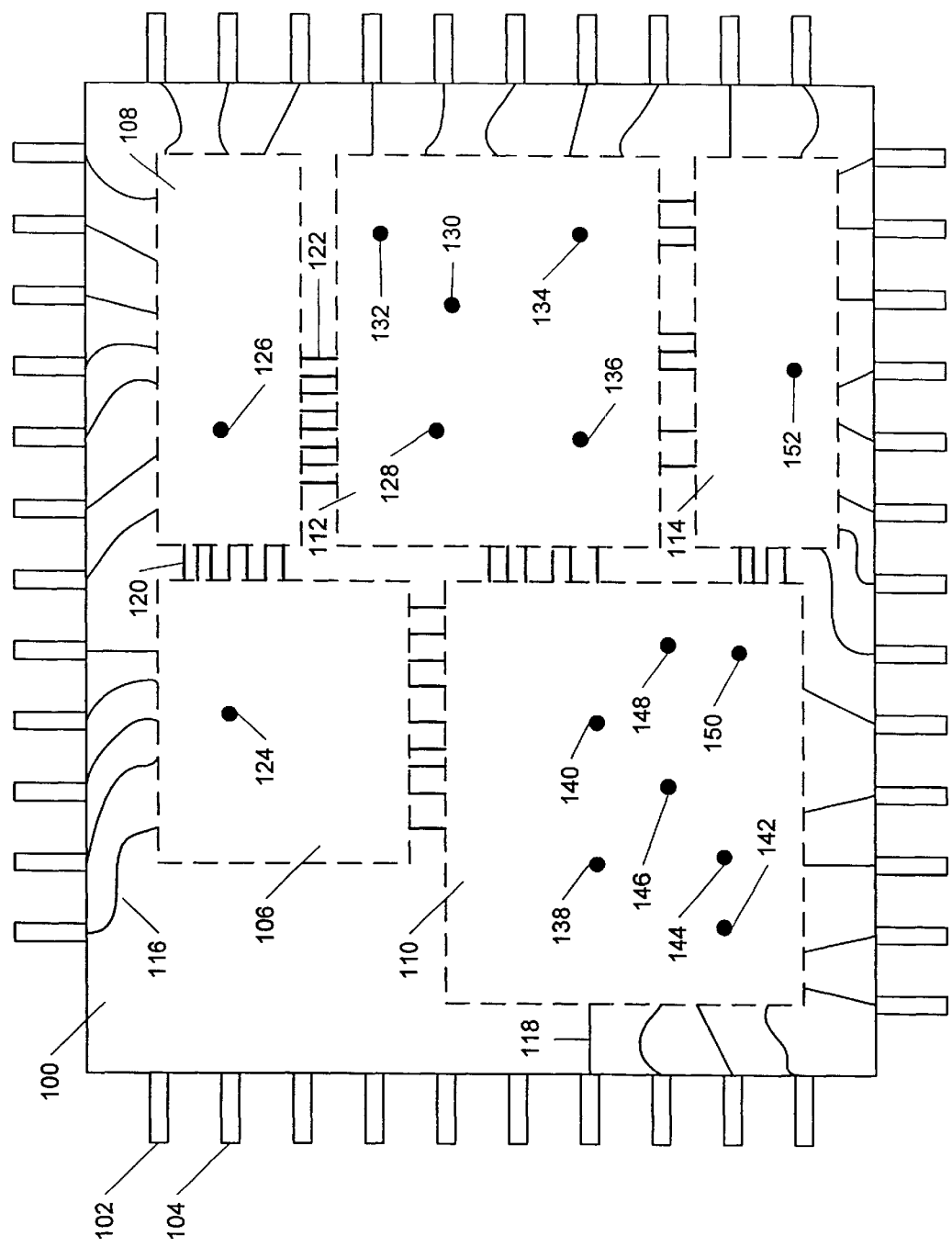
FIG. 1 is a non-scale block schematic diagram of a conventional integrated ASIC circuit showing the external pins, a typical functional layout and a plurality of test points which must be monitored.

FIG. 1 shows a schematic view of an Application Specific Integrated Circuit 100. It should be noted that this figure is not drawn to scale and has been greatly simplified in order to clearly convey the concepts involved. An actual ASIC would be much more complicated with a much larger number of external pins 102, 104.

A typical ASIC, such as ASIC 100, is arranged in a functional layout with areas of the circuit devoted to a particular function. These functional modules are indicated as dotted boxes 106, 108, 110, 112 and 114. The functional modules may be interconnected by means of internal leads with are schematically illustrated, for example, at 120 and 122. In addition, the modules can be connected to the external pins by connections schematically illustrated as connections 116 and 118, for example.

Each of the functional modules on the chip 100 may contain test points which the circuit designer desires to monitor electrically. For example, module 106 may have test point 124, whereas module 8 may have test point 126. Each module may have one or more test points; some modules may have many test points. For example, module 112 has test points 128–134 and module 110 has test points 138–150; whereas module 114 only has a single point 152. The arrangement shown in FIG. 1 is illustrative only. A person skilled in the art would understand that a conventional ASIC can have a variety of configurations and test points. The number of test points could vary from a few to many thousands of points.

Figure 2:
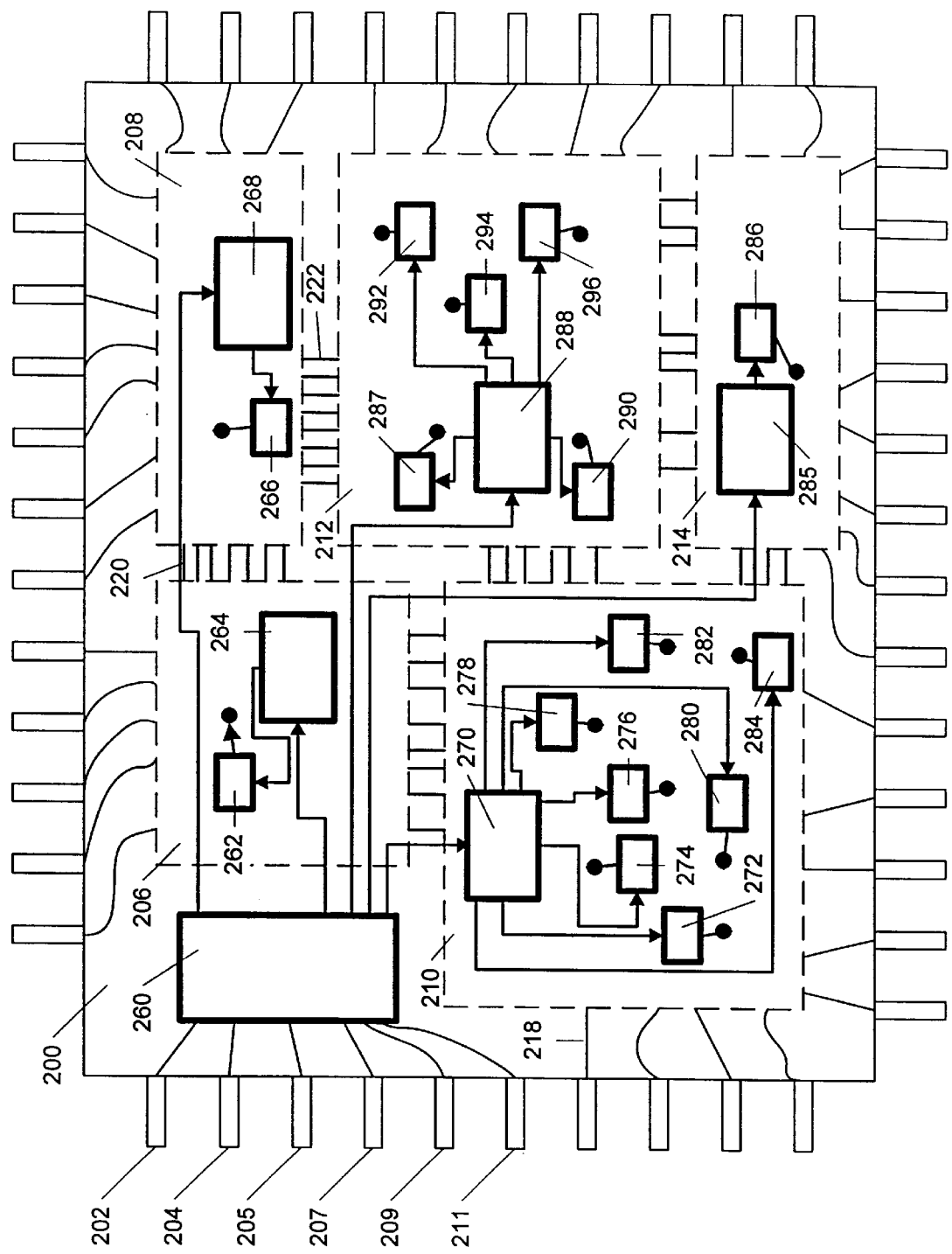
FIG. 2 is a non-scale block schematic diagram of an illustrative integrated ASIC circuit showing the inventive addressable node monitoring system overlaid on the circuit of FIG. 1 and connected to the test points.

FIG. 2 illustrates the circuit of FIG. 1 with the inventive addressable node monitoring system in place. Elements in FIG. 2 which correspond to elements in FIG. 1 have been given corresponding numeric designations. For example, chip 100 in FIG. 1 corresponds to chip 200 in FIG. 2. The inventive system consists of a hierarchical tree of nodes, each of which can be separately addressed and enabled. This system of nodes is constructed on the chip along with, and part of, the ASIC functional modules.

A primary node 260 connects to the environment outside the chip 200 by means of connections to external pins 202–211. These pins allow the primary node 260 to receive address information, clock information and enable and control signals. The external connections also allow the primary node to pass data between one of the external pins 202–211 and a selected test point which is to be observed.

The primary node 260 can be connected to one or more intermediate nodes, each of which is separately addressable in accordance with the principles of the invention. For example, in FIG. 2, primary node 260 is connected to secondary nodes 264, 268, 270, 288 and 285. Illustratively, each of the secondary nodes might be located in one of the functional modules. For example, secondary node 264 is located in module 206 and secondary node 268 is located in module 208. Similarly, secondary nodes 270, 288 and 285 are located in modules 210, 212 and 214, respectively. Each of the intermediate nodes, such as node 264, can be connected to other intermediate nodes. Alternatively, as shown in FIG. 2, the intermediate node 264 can be connected to an observation node 262 which is, in turn, connected to a test point that is to be observed. The observation node 262, as will hereinafter be explained, contains isolation buffers which allow the test system to be isolated from the observation points to prevent the test and monitoring system from electrically loading the test points.

Similarly, intermediate node 268 is connected to observation node 266. Each intermediate node may be connected to one or more observation nodes. For example, intermediate node 260 is connected to observation nodes 272–284. Similarly, intermediate node 288 is connected to observation nodes 287–296. Intermediate node 285 is connected to observation node 286. Due to the hierarchical nature of the node addressing arrangement, the connections between the primary node 260 and the intermediate nodes 264–288 are kept to a minimum. In FIG. 2, only a small number of connections are required between the primary node 260 and the intermediate node in each functional module. This is in contrast to the number of connections that would be required if each observation node were connected directly to the primary node as in prior art arrangements.

Figure 3:
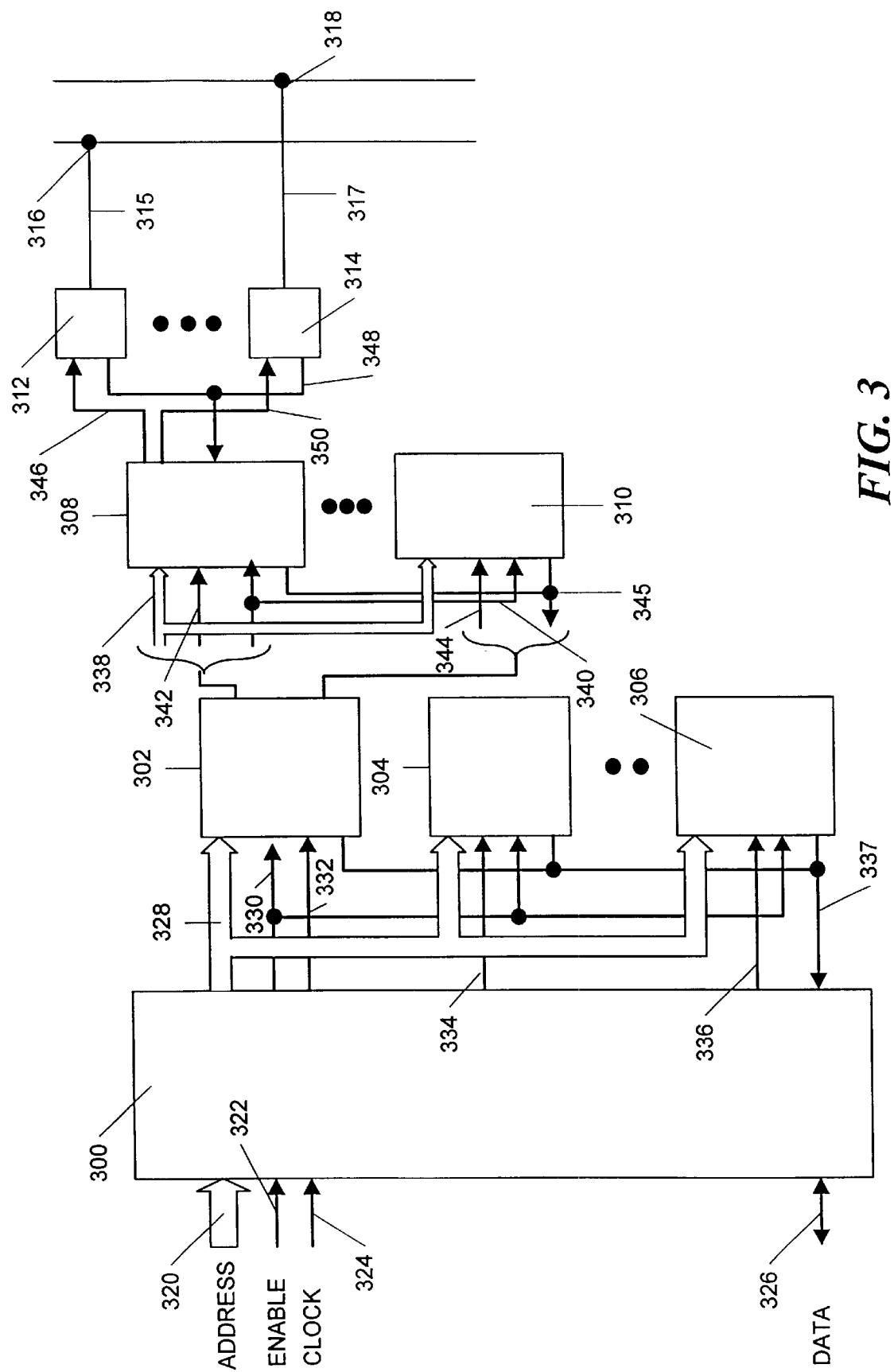
FIG. 3 is a block schematic view of the inventive addressable node hierarchy illustrating how each of the nodes is interconnected.

FIG. 3 illustrates an illustrative hierarchy of addressable nodes constituting the inventive monitoring system. The primary node 300 receives address signals 320, an enable signal 322 and a clock signal 324 from external monitoring apparatus. The primary node 300, in turn, communicates with the external monitoring apparatus by mans of bi-directional data path 326.

The primary node 300 is connected to a first intermediate node level, of which nodes 302–306 are illustratively shown. The nodes on the first intermediate node level are, in turn, connected to nodes in a second intermediate node level which includes nodes such as nodes 308 and 310. Finally, the nodes in the second intermediate node level are connected to an observation node set of which observation nodes 312 and 314 are shown. These observation nodes are connected to the test points under observation, for example, test points 316 and 318.

In the primary node 300, a portion of the address signal represented by address bus 320 are decoded to generate the plurality of enable signals, one for each node in the first level of intermediate nodes. For example, enable signal 332 is generated for node 302, enable signal 334 is generated for node 304 and enable signal 336 is generated for node 306. Only one enable signal is generated at a time and used to enable one selected node.

The remainder of the address signals are provided, via an address bus 328, to each of the intermediate nodes 302–306. Each intermediate node is also provided in parallel with a clock signal 330. The nodes return data signals in parallel as indicated by bus 337 to the primary node 300.

In accordance with the address signals on address bus 320, primary node 300 generates an enable signal on one of the enable leads 332–336, thus enabling one node in the first intermediate node level. For example, if node 302 is enabled, it then processes the address signals, providing a portion of the address signals to an internal address decoder.

The address decoder generates an enable signal for one of the nodes 308 and 310 in the second intermediate node level. For example, an enable signal 342 might be provided to node 308 or an enable signal 344 might be provided to node 310. As with the nodes in the first intermediate level, the remainder of the address signals on bus 338 are provided in parallel to nodes 308 and 310. In addition, a clock signal is provided in parallel as indicated by bus 340 to nodes 308 and 310. Nodes 304 and 306 operate in a similar fashion to that described above for node 302 depending on whether they are enabled or not.

Since nodes 308 and 310 are in the lowest intermediate node level, each of the nodes communicates directly with the observation nodes, of which nodes 312 and 314 are illustrated. The nodes in the lowest intermediate level generates enable signals for one of the observation nodes. For example, node 308 can generate an enable signal 346 for node 312 or an enable signal 350 for node 314. Thus, in accordance with the particular address supplied to node 308, one of the observation nodes 312 and 314 is enabled. For example, assuming node 312 is enabled, the signal present at test point 316 is provided by a connection 315 through enabled observation node 312 to data bus 348. The data then returns through the enabled ones of nodes 308 and 310, via data bus 345 to the first intermediate node level. The data then returns through the enabled one of nodes 302–306 and data bus 337 to the primary node 300 which returns the data via data bus 326 to the external monitoring circuitry.

Figure 4:
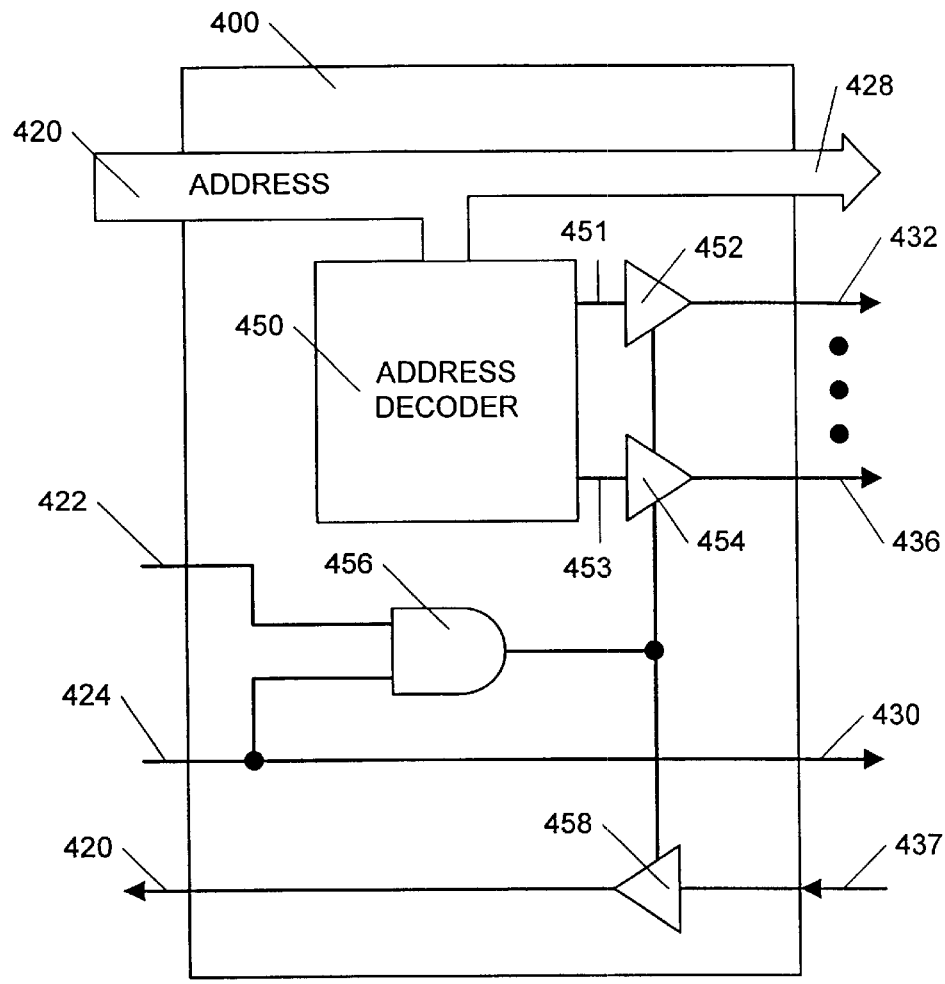
FIG. 4 is a block schematic diagram of the contents of a mid-level node.

The internal construction of the primary and intermediate nodes is illustrated in FIG. 4. A node 400 receives address signals on an address bus 420. A portion of these signals are stripped off, for example, the upper address bits, and applied to an address decoder 450. The address decoder in a conventional and well-known circuit which decodes the address and generates an enable signal one of its output leads of which outputs 451 and 453 are illustrated. The output leads are connected to output buffer circuits 452–454. These are, in turn, controlled by the output of AND gate 456 which receives an incoming enable signal on lead 422 and a clock signal on lead 424.

If the node 400 has been enabled by an incoming enable signal 422 and the clock signal on lead 424 is in a high logic state AND gate 456 enables output gates 452–454 thereby allowing an enable signal on decoder outputs 451–453 to pass through to one of the enable output leads 432–436. This enables signal enables the node in the next succeeding node level which is connected to the appropriate output lead. In addition, the clock signal on lead 424 pass through the node 400 and appears as a clock signal 430 at the node output to be applied to the next successive level of nodes.

Data returning from the observed test point arrives, via bus 437, and is applied to buffer 458. If the node is enabled as indicated by a high output on the AND gate 456, buffer 458 is enabled and the data is passed through to the return data bus 426 and up the hierarchy of nodes to the primary node and the external monitoring circuitry.

Figure 5:
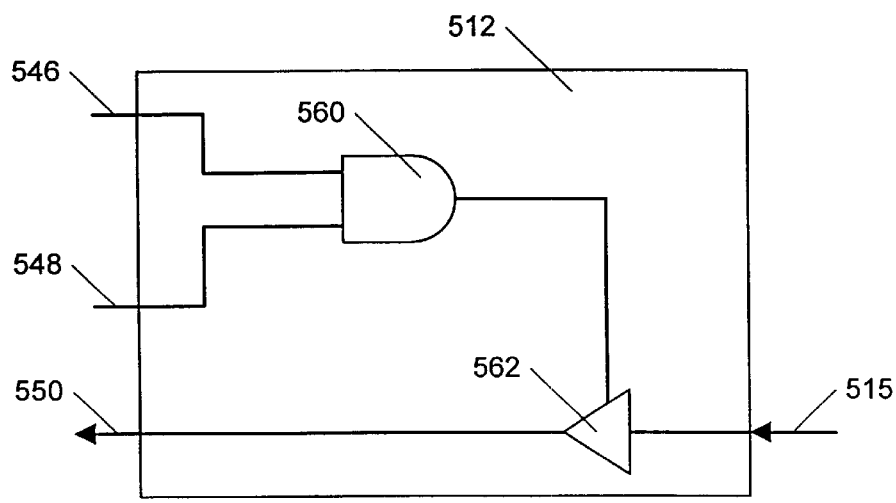
FIG. 5 is a block schematic diagram of the contents of an observation node.

FIG. 5 illustrates the internal construction of an observation node. The observation node 512 receives enable signal on its input lead 546 and a clock signal on its clock input 548. Both of these signals are applied to AND gate 560. When both signals are present, AND gate 560 enables isolation buffer 562. Isolation buffer 562 normally disconnects the observation node from the test point to be observed in order to avoid the test circuit from loading the test point. When isolation buffer 562 is enabled, it allows a connection between the test point via lead 515 to return bus 550. The data on the test point then propagates up the node hierarchy to the primary node.

Although an exemplary embodiment of the invention has been disclosed, it will be apparent to those skilled in the art that various changes and modifications can be made which will achieve some of the advantages of the invention without departing from the spirit and scope of the invention. For example, it will be obvious to those reasonably skilled in the art that, although the description was directed to a particular ASIC construction, that other designs could be used in the same manner as that described. Other aspects, such as the specific circuitry utilized to achieve a particular function, as well as other modifications to the inventive concept are intended to be covered by the appended claims

What is claimed is:

1. Apparatus for on-chip monitoring of a test point in an integrated circuit with a distributed system, comprising:

a plurality of nodes connected in a hierarchy extending from a primary node which is connected to one or more nodes in at least one intermediate node level, one or more of which are connected to the test point;

a mechanism for enabling the primary node and one node in each intermediate node level, the enabling mechanism comprising a decoder in each node responsive to address signals received from another node in the hierarchy for generating an enable signal to enable a node in a succeeding level in the hierarchy;

a mechanism for establishing a data path connecting all of the enabled nodes to form a data path between the test point and the primary node, the data path establishing apparatus comprising a data path segment connecting each node to a preceding node in the hierarchy and a buffer responsive to an enable signal for establishing a data path through the each node; and a clock signal which is propagated from each node to each succeeding node in the hierarchy and wherein the buffer is responsive to both the enable signal and the clock signal for establishing a data path through the each node.

2. Apparatus according to claim 1 wherein the decoder is responsive to an enable signal received from another node in the hierarchy for generating an enable signal to enable a node in a succeeding level in the hierarchy.

3. Apparatus according to claim 1 wherein the hierarchy is a tree hierarchy.

4. Apparatus for on-chip monitoring of a test point in an integrated circuit with a distributed system, comprising:

a plurality of nodes connected in a hierarchy extending from a primary node which is connected to one or more nodes in at least one intermediate node level, one or more of which are connected to the test point;

a mechanism for enabling the primary node and one node in each intermediate node level; and a mechanism for establishing a data path connecting all of the enabled nodes to form a data path between the test point and the primary node, wherein the hierarchy is connected to the test point with an isolation buffer to prevent the test point from being electrically loaded when the apparatus for on-chip monitoring is not in use.

5. Apparatus according to claim 4 wherein the isolation buffer cooperates with the enabling mechanism to connect the hierarchy to the test point.

6. A method for on-chip monitoring of a test point in an integrated circuit with a distributed system, comprising:

(a) constructing a plurality of nodes connected in a hierarchy extending from a primary node which is connected to one or more nodes in at least one intermediate node level, one or more of which are connected to the test point;

(b) enabling the primary node and one node in each intermediate node level, the enabling step comprising generating an enable signal to enable a node in a succeeding level in the hierarchy with a decoder in each node responsive to address signals received from another node in the hierarchy;

(c) propagating a clock signal from each node to each succeeding node in the hierarchy; and (d) establishing a data path connecting all of the enabled nodes to form a data path between the test point and the primary node, the establishing step comprising connecting a data path segment connecting each node to a preceding node in the hierarchy and establishing a data path through the each node with a buffer that is responsive to both the enable signal and the clock signal.

7. A method according to claim 6 wherein step (b) further comprises generating an enable signal to enable a node in a succeeding level in the hierarchy with a decoder that is responsive to an enable signal received from another node in the hierarchy.

8. A method according to claim 6 wherein the hierarchy is a tree hierarchy.

9. A method for on-chip monitoring of a test point in an integrated circuit with a distributed system, comprising:

(a) constructing a plurality of nodes connected in a hierarchy extending from a primary node which is connected to one or more nodes in at least one intermediate node level, one or more of which are connected to the test point;

(b) enabling the primary node and one node in each intermediate node level;

(c) establishing a data path connecting all of the enabled nodes to form a data path between the test point and the primary node; and (d) connecting the hierarchy to the test point with an isolation buffer to prevent the test point from being electrically loaded when the method for on-chip monitoring is not in use.

* * * * *